(12) United States Patent
Kugler et al.

(10) Patent No.: US 11,281,114 B2
(45) Date of Patent: Mar. 22, 2022

(54) PROJECTION EXPOSURE APPARATUS FOR SEMICONDUCTOR LITHOGRAPHY

(71) Applicant: Carl Zeiss SMT GmbH, Oberkochen (DE)

(72) Inventors: Jens Kugler, Aalen (DE); Mark Feygin, Aalen (DE); Stefan Xalter, Oberkochen (DE); Bernhard Gellrich, Aalen (DE); Stefan Hembacher, Bobingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/023,961

(22) Filed: Sep. 17, 2020

(65) Prior Publication Data
US 2021/0080841 A1 Mar. 18, 2021

(30) Foreign Application Priority Data
Sep. 18, 2019 (DE) .......................... 102019214242.7

(51) Int. Cl.
*G03F 7/20* (2006.01)

(52) U.S. Cl.
CPC ........ *G03F 7/70825* (2013.01); *G03F 7/7085* (2013.01); *G03F 7/70258* (2013.01);
(Continued)

(58) Field of Classification Search
CPC ............... G03F 7/70833; G03F 7/7085; G03F 7/70008; G03F 7/70975; G03F 7/708;
(Continued)

(56) References Cited

U.S. PATENT DOCUMENTS 10,386,733 B2  8/2019  Freimann et al.
2004/0212792 A1  10/2004  Miyajima
(Continued)

FOREIGN PATENT DOCUMENTS

DE  10 2015 211 286 A1  12/2016
DE  10 2018 200 178 A1  1/2019
(Continued)

OTHER PUBLICATIONS

Notification of Transmittal of the International Search Report and the Written Opinion of the International Searching Authority, or the Declaration for related International Application No. PCT/EP2020/075725, dated Dec. 22, 2020, 16 pages.

*Primary Examiner* — Christina A Riddle
(74) *Attorney, Agent, or Firm* — Fish & Richardson P.C.

(57) ABSTRACT

A projection exposure apparatus for semiconductor lithography having a projection optical unit. The projection optical unit includes a sensor frame, a carrying frame, and a module. The module includes an optical element and actuators for positioning and orienting the optical element. The module is on the carrying frame, and the sensor frame is a reference for the positioning of the optical element. The module includes an infrastructure which includes interfaces for separating a module from the projection optical unit. A method exchanges the module of a projection optical unit of a projection exposure apparatus for semiconductor lithography, wherein the module includes an optical element, while the reference remains in the projection exposure apparatus.

29 Claims, 6 Drawing Sheets

(52) U.S. Cl.
CPC ...... *G03F 7/70833* (2013.01); *G03F 7/70975* (2013.01); *G03F 7/70008* (2013.01)

(58) Field of Classification Search
CPC ............. G03F 7/70825; G03F 7/70316; G03F 7/70808; G03F 7/70841; G03F 7/70858; G03F 7/70883; G03F 7/70891; G03F 7/709; G03F 7/70908; G03F 7/7095; G03F 7/70983; G03F 7/70991; G03F 7/70258–70266; G02B 7/1827; G02B 7/023; G02B 7/1822
USPC .............................. 355/18, 30, 52–55, 67–77
See application file for complete search history.

(56) References Cited

U.S. PATENT DOCUMENTS

| | | | |
|---|---|---|---|
| 2005/0046979 A1 | 3/2005 | Hiley et al. | |
| 2008/0174758 A1* | 7/2008 | Gellrich | G03F 7/70825 355/67 |
| 2009/0174874 A1* | 7/2009 | Rau | G02B 7/008 355/67 |
| 2010/0195085 A1* | 8/2010 | Fuse | G03F 7/70525 355/74 |
| 2019/0086813 A1 | 3/2019 | Loopstra et al. | |
| 2019/0094705 A1 | 3/2019 | Kugler et al. | |
| 2021/0255554 A1* | 8/2021 | Pollak | G03F 7/70591 |

FOREIGN PATENT DOCUMENTS

| | | | | |
|---|---|---|---|---|
| DE | 102018220565 A1 * | 6/2020 | ............ | G03F 7/706 |
| EP | 1 471 390 A2 | 10/2004 | | |
| WO | WO 2018/114117 A1 | 6/2018 | | |

\* cited by examiner

PROJECTION EXPOSURE APPARATUS FOR SEMICONDUCTOR LITHOGRAPHY

CROSS-REFERENCE TO RELATED APPLICATIONS

This application claims benefit under 35 U.S.C. § 119 to German Application No. 10 2019 214 242.7, filed on Sep. 18, 2019, the content of which is fully incorporated by reference herein.

FIELD

The disclosure relates to a projection exposure apparatus for semiconductor lithography.

BACKGROUND

Projection exposure apparatuses are commonly used for producing extremely small structures, such as on semiconductor components or other microstructured component parts. An operating principle of the apparatuses is often based on the production of very small structures down to the nanometres range by way of generally reducing imaging of structures on a mask, using what is referred to as a reticle, on an element to be structured that is provided with photosensitive material. In general, the minimum dimensions of the structures produced are directly dependent on the wavelength of the light used. Recently, light sources having an emission wavelength in the range of a few nanometres, for example between 5 nm and 120 nm, such as in the region of 13.5 nm, have increasingly been used. The described wavelength range is also referred to as the EUV range. These projection exposure apparatuses, in particular for the EUV range, can be complex and include inter alia an illumination optical unit and a projection optical unit, which are commonly mechatronic systems and thus can have highly complex actuators, sensors and also cooling and decoupling systems. Projection optical units typically have 6 to 10 mirrors, a large portion of the mirrors being adjustable in up to six degrees of freedom. As a result, these systems can include up to 60 actuators and more than 100 sensors. Besides the highly accurate sensors for mirror positioning, a large number of sensors are often used for temperature measurements, system start, acceleration measurements and further detection of physical properties. On account of the large number of systems and subsystems it can be very difficult or even impossible, as a practical matter, to guarantee the function and imaging quality of the overall system over the lifetime. Therefore, it is sometimes assumed that, for example, the positional control of a mirror will fail during the lifetime on account of a failed actuator. Generally, a redundant construction of the system is possible only to a limited extent on account of the desired properties with respect to controllability and also the real structural space situation. A further desired property of complex projection exposure apparatuses can be a fundamental capability for the retrofitting of functions and components, such as, for example, a deformable optical element or optical elements having further developed layers for the projection optical unit. As a result, firstly the quality and the imaging properties of the projection exposure apparatus can be improved, and secondly it is possible to react to effects that are still unknown at the time of development. Some known projection exposure apparatuses provide the possibility of exchanging components defined in advance, which are usually selected in an early optical design status, such that a preferred accessibility can be taken into account during the development of the projection exposure apparatus. In this case, it may be possible to exchange preferably the first and last optical elements in the beam path and only few elements within the beam path. The proportion of exchangeable optical elements in such systems can be in the range of <=20%. In general, all other optical elements are not alterable over the lifetime of the system without the exchange of the projection optical unit, of some other system or of the overall system.

On account of complex process developments and costly commissioning for a projection exposure apparatus, wherein the differences between different projection exposure apparatuses that are within the scope of the specifications, the so-called fingerprint, and in particular the imaging properties that are greatly influenced by the projection optical unit are also taken into account, the trivial solution for retrofitting, namely the exchange of an entire system, such as the projection optical unit, is unacceptable.

SUMMARY

The present disclosure seeks to provide an improved apparatus. The present disclosure also seeks to provide a method for exchanging components in a projection lens and in a projection exposure apparatus.

In an aspect, the disclosure provides a projection exposure apparatus for semiconductor lithography having a projection optical unit which includes: a sensor frame; a carrying frame; and a module having an optical element and actuators for positioning and/or orienting the optical element. The module is arranged on the carrying frame, and the sensor frame is a reference for the positioning and/or orientation of the optical element. The module includes an infrastructure, which is configured so that it includes interfaces for separating the module from the projection optical unit. The modular construction of the projection optical unit can allow the individual modules to be exchanged in the field, that is to say where the end customer has installed them. The so-called fingerprint, that is to say the imaging features inherent to each projection exposure apparatus, can be maintained to the greatest possible extent. This can be of particular relevance in so far as during the production of electronic components, besides the imaging quality of the projection optical unit itself, the exposure process and, in particular, the process for the light-sensitive coating can also have a substantial influence on the quality of the structure. The inherent features of each individual projection exposure apparatus are therefore usually taken into account in these processes. Furthermore, an individual module can be transported more easily on account of its smaller geometry and the complexity for an exchange is also advantageously simplified visa vis the exchange of a projection optical unit.

The infrastructure can include electrical and/or optical lines and/or lines for a fluid. The modules can be separated from all these lines independent of the other modules, that is to say that it is possible to remove only one module from the projection optical unit, without the other modules losing their position in the process.

The infrastructure of a plurality of modules can be connected in parallel with one another. The lines of the infrastructure can be configured in a continuous fashion and include a branching for each module, such that a plurality or all of the modules can be supplied in parallel by an infrastructure line.

Optionally, the infrastructure of a plurality of modules can be connected in series with one another. In this case, the lines of the infrastructure can at least partly include the lines of the modules, such that the infrastructure line extends from one module to the other and connects them in series. If a module is demounted, then the interfaces of the infrastructure between the modules can be released and the module can be removed. Optionally, the modules and in particular the sensors of the modules remaining in the projection exposure apparatus are not altered mechanically upon the demounting of the one module, and can therefore be put into operation again without renewed setting up and/or calibration of the modules and/or sensors after the demounted module has been reinstalled.

At least one module can include a module carrying frame. The module carrying frame can be configured so that it can determine the stiffness of the module and can function as a central mechanical component of the module.

The actuators can be arranged on the module carrying frame. The actuators can be demounted with the module carrying frame in the case of a module being demounted. It is possible to carry out an exchange of the actuators on the demounted module, which can simplify the exchange of an actuator on account of the better accessibility.

The actuators can be exchanged without the module carrying frame being demounted. This can allow that, in the case of a defective actuator, the outlay for an exchange can be reduced to a minimum since all the other components, such as the sensors, are not moved mechanically and, as a result, the commissioning of the module after the exchange of the actuator is also greatly simplified.

At least one module can include a sensor. The sensor can be constructed in a bipartite fashion and include a sensor element and a sensor reference, wherein the sensor element can be connected to the module.

The reference of the sensor can be arranged on the sensor frame.

The reference of the sensor can be configured so that it is not altered as a result of the module being demounted. This can allow that the commissioning of the module and of the entire projection exposure apparatus after the exchange of a module is relatively simple and the outage times of the projection exposure apparatus can be reduced.

The sensor can be, for example, an interferometer or an encoder. A portion of the sensors arranged in modules can be an interferometer, and another portion of the sensors can be an encoder. The choice for the type of sensor can depend predominantly on the arrangement of the module with respect to the sensor frame and the usually limited structural space conditions. Any other type of a sensor suitable for the task is conceivable.

If the sensor is an interferometer, it can include a sensor reference and a sensor element arranged from each other at a distance of at least 10 centimeters (e.g., at least 25 centimeters, at least 50 centimeters, at least 75 centimeters, at least 100 centimeters) and/or at most 200 centimeters (e.g., at most 175 m, at most 150 centimeters, at most 125 centimeters, at most 100 centimeters). In some embodiments, the sensor reference and the sensor element are arranged from each other at a distance of from 10 centimeters to 200 centimeters.

The module carrying frame can include mechanical interfaces for positioning and orienting on the carrying frame. The carrying frame can be a central component of the projection exposure apparatus, to which all the modules can be mechanically connected.

The module carrying frame can be configured so that, when the module carrying frame is connected to the carrying frame, the stiffness of the carrying frame is increased. The carrying frame and the module carrying frame can have a low stiffness and can be more easily configured as a result. A screw, for example, can provide the connection of the module carrying frame to the carrying frame.

The module carrying frame can be connected to the carrying frame in an overdetermined manner (having excessive or redundant connections). As a result of the overdetermined mounting of the module carrying frame, for example, the screw-on forces can be increased and the overall stiffness of the modules screwed to the carrying frame can thus be increased. A force-locking connection brought about by friction can also be designed for higher operating loads and/or also transport loads, such as shocks, for example. A deformation possibly caused by the overdetermined mounting can be decoupled by the actuators and not transferred to the optical element.

The sensor frame can be present in the volume defined by the carrying frame. This can allow the sensor frame to be constructed compactly and, as a result, have low moments of inertia, as a result of which in turn the vibrations brought about by external excitation can be reduced.

The sensor frame can include a plurality of subframes. The multipartite construction of the sensor frame can allow that firstly manufacture and assembly, and secondly the transport of the individual parts can be simplified.

The subframes among one another can be referenced with respect to one another by way of sensors. The referencing of the subframes among one another can have the effect that the positions of the individual frames with respect to one another, the positions varying as a result of movements of the frames with respect to one another, may be always known and, as a result, the sensor frame may be used as a common reference for all of the modules.

Each optical element of the projection optical unit can be present in a dedicated module. This can allow that, irrespective of the optical element or module at which a fault or damage occurs, the projection exposure apparatus can be ready for operation again with a minimal outage time.

The projection exposure apparatus can be configured so that the module can be exchanged with a projection optical unit mounted in the projection exposure apparatus. An exchange of a module while the projection optical unit is still installed in the projection exposure apparatus can reduce the outlay for the exchange and thus the outage time of the projection exposure apparatus, which in turn can reduce the production costs of the electronic components.

In an aspect, the disclosure provides a method for exchanging a module of a projection optical unit of a projection exposure apparatus for semiconductor lithography. The module includes an optical element. A reference for positioning and/or orienting the optical element remains in the projection exposure apparatus during the exchange of the module. This can reduce the outlay for the exchange of an optical element, such as, for example, a mirror, an actuator or any other component of a module.

The exchange of the module can be carried out without an alteration on any of the other modules. The referencing of the other modules can remain unchanged, which can reduce the commissioning duration after an exchange.

The module can be calibrated after the exchange. The calibration of a module can be less complex in comparison with the calibration of an entire projection optical unit.

The projection exposure apparatus can be ready for operation again after the exchange and calibration of the module. It may not necessary for any other module or a group of modules of the projection exposure apparatus to be put into operation.

The exchange of the module can be carried out without an alteration on a sensor frame. Optionally, a part of the calibration of the module can be obviated and the commissioning duration can be advantageously reduced further.

A mount in a reticle module and/or wafer module can be moved into a parking position for the exchange of the module. In order to transfer a reticle and/or wafer, it is possible to move to so-called parking positions in the reticle module and/or wafer module, as a result of which the access to the modules arranged below and/or respectively above the reticle and/or wafer, respectively, can be simplified. Despite the arrangement of the optical elements with respect to the reticle module or wafer module and the given structural space conditions, a module can be exchanged without additional outlay.

The reticle module or wafer module can be demounted for the exchange of the module.

The projection optical unit can be removed from the projection exposure apparatus for the exchange of the module, for example when accessibility to the modules with the projection optical unit installed is not practical or even possible.

Optionally, the exchange of a module can have no influence on the process for exposing wafers which is set (optimized) for the projection exposure apparatus. During the production of electronic components, besides the imaging quality of the projection optical unit, the exposure process and, in particular, the process in the light-sensitive coating during the exposure and in the subsequent processing thereof, can also influence the quality of the structure. These processes may be optimized to the properties specific to each imaging. The imaging can already be significantly altered as a result of demounting of a projection optical unit and renewed mounting with the same optical elements, such that the process has to be optimized once again. By virtue of only one module being exchanged, with the arrangement of all the other modules simultaneously being maintained, the change of the individual imaging properties can be kept small enough that the existing process can continue to be used without adaptation.

Optionally, more than 80% (e.g., more than 90%, 100%) of the optical elements of the projection optical unit can be exchanged without an alteration on any of the other modules.

In an aspect, the disclosure provides a projection exposure apparatus that includes a projection optical unit. The projection optical unit includes: a sensor frame; a carrying frame; and a module supported by the carrying frame. The module includes: an optical element; actuators configured to position and/or orient the optical element; an infrastructure comprising interfaces configured to separate the module from the projection optical unit; and a module carrying frame connected to the carrying frame in an overdetermined manner. The sensor frame is a reference for positioning and/or orienting the optical element. The projection exposure apparatus is a semiconductor lithography projection exposure apparatus.

In an aspect, the disclosure provides a projection optical unit that includes: a sensor frame; a carrying frame; and a module supported by the carrying frame. The module includes: an optical element; actuators configured to position and/or orient the optical element; an infrastructure comprising interfaces configured to separate the module from the projection optical unit; and a module carrying frame connected to the carrying frame in an overdetermined manner. The sensor frame is a reference for positioning and/or orienting the optical element. The projection optical unit is a semiconductor lithography projection optical unit.

In an aspect, the disclosure provides a projection exposure apparatus that includes a projection optical unit. The projection optical unit includes: a sensor frame; a carrying frame; and a module supported by the carrying frame, the module configured to house an optical element. The module includes: an infrastructure comprising interfaces configured to separate the module from the projection optical unit; and a module carrying frame connected to the carrying frame in an overdetermined manner. The sensor frame is a reference for positioning and/or orienting the optical element, and the projection exposure apparatus is a semiconductor lithography projection exposure apparatus.

In an aspect, the disclosure provides a projection optical unit that includes: a sensor frame; a carrying frame; and a module supported by the carrying frame, the module configured to house an optical element. The module includes: an infrastructure comprising interfaces configured to separate the module from the projection optical unit; and a module carrying frame connected to the carrying frame in an overdetermined manner. The sensor frame is a reference for positioning and/or orienting the optical element, and the projection optical unit is a semiconductor lithography projection optical unit.

In an aspect, the disclosure provides a method that includes exchanging a first module of a projection optical unit of a semiconductor lithography projection exposure apparatus. The module includes an optical element, and a reference for positioning and/or orienting the optical element remains in the projection exposure apparatus during the exchange of the first module.

BRIEF DESCRIPTION OF THE DRAWINGS

Exemplary embodiments and variants of the disclosure are explained in more detail below with reference to the drawings, in which.

DESCRIPTION OF EXEMPLARY EMBODIMENTS

Figure 1:
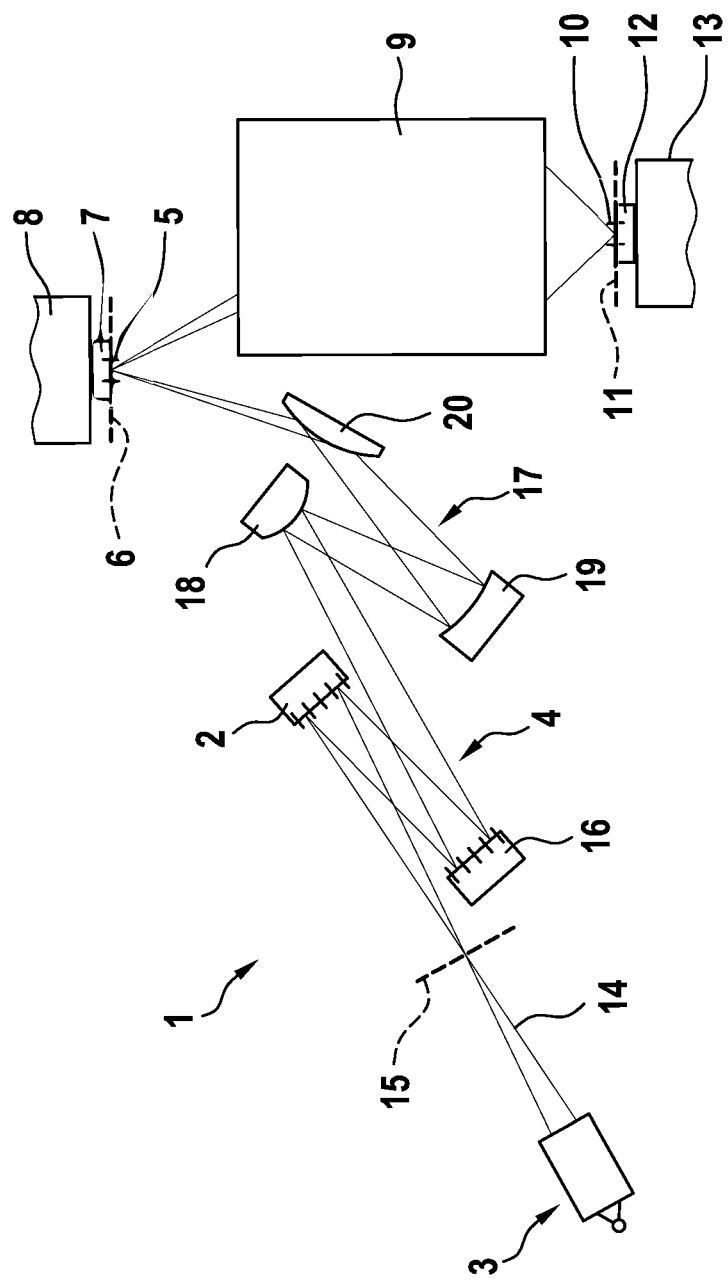
FIG. 1 shows the basic construction of an EUV projection exposure apparatus in which the disclosure can be implemented.

FIG. 1 shows an example of the basic construction of a microlithographic EUV projection exposure apparatus 1 in which the disclosure can be used. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned using a collector, which is integrated in the light source 3, in such a way that it passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7 arranged in the object field 5 and held by a schematically illustrated reticle holder 8 is illuminated. A merely schematically illustrated projection optical unit 9 serves for imaging the object field 5 into an image field 10 in an image plane 11. A structure on the reticle 7 is imaged on a light-sensitive layer of a wafer 12 arranged in the region of the image field 10 in the image plane 11 and held by a likewise partly represented wafer holder 13. The light source 3 can emit used radiation in particular in a wavelength range of between 5 nm and 120 nm.

The disclosure can likewise be used in a DUV apparatus, which is not illustrated. A DUV apparatus is set up in principle like the above-described EUV apparatus 1, wherein mirrors and lens elements can be used as optical elements in a DUV apparatus and the light source of a DUV apparatus emits used radiation in a wavelength range of 100 nm to 300 nm.

Figure 2:
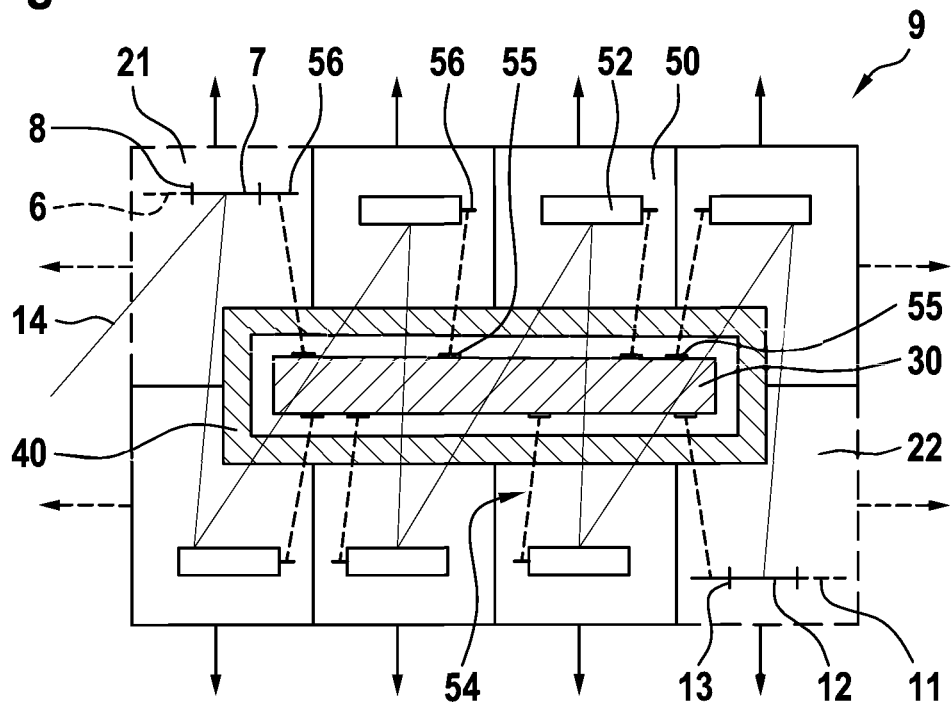
FIG. 2 shows the basic construction of an EUV projection optical unit according to the disclosure.

FIG. 2 shows a basic construction of a projection optical unit 9 according to the disclosure in a sectional illustration. The projection optical unit 9 includes six optical modules 50 and is connected to a reticle module 21 and a wafer module 22. The modules 50, 21, 22 are arranged around a central sensor frame 30 and are connected to a carrying frame 40. The modules 50, 21, 22 can also additionally be connected among one another. In this case, the modules 50, 21, 22 can be configured so that they can be separated from the projection optical unit 9 in the direction of the arrows, without any other module 50, 21, 22 having to be altered as a result. The remaining modules 50, 21, 22 do not have to be calibrated or oriented anew after the demounted module 50, 21, 22 or an identical replacement module 50, 21, 22 has been reinstalled, with the result that only the exchanged module 50, 21, 22 has to be calibrated anew, if appropriate. Arrangements of the modules 50, 21, 22 are also conceivable in which, for an optical module 50 arranged for example further in the direction of the sensor frame 30 in the interior of the projection optical unit 9, firstly a first module 50, 21, 22 situated further out has to be demounted. The modules 50, 21, 22 are configured so that they can be demounted and installed again without the other modules 50, 21, 22 or the module 50, 22, 11 itself being influenced.

The optical modules 50 include at least one sensor 54 which includes a sensor element 56 and a sensor reference 55. While the sensor element 56 is arranged on the optical element 52, the sensor reference 55 is arranged on the sensor frame 30 and thus determines the position and location of the optical element with respect to the sensor frame 30 and thus with respect to all the other optical modules 50, the reticle module 21 and the wafer module 22. The sensors 54 can be, for example, interferometers or as encoders.

When interferometric sensors 54 are used, the sensor element 56 may include a mirror which reflects optical radiation emitted by a sensor reference 55 which can be a sensor head of the interferometric sensor 54. It is possible to arrange the sensor reference 55 and the sensor element 56 at a distance from each other of at least 10 centimeters (e.g., at least 25 centimeters, at least 50 centimeters, at least 75 centimeters, at least 100 centimeters) and/or at most 200 centimeters (e.g., at most 175 m, at most 150 centimeters, at most 125 centimeters, at most 100 centimeters). In some embodiments, the sensor reference 55 and the sensor element 56 are arranged from each other at a distance of from 10 centimeters to 200 centimeters. Using interferometric sensors can make it possible for sensor frame 30 to be relatively compact, which can be advantageous with respect to the excitation of oscillations. A more compact sensor frame 30 can allow for more free installation space. A more compact sensor frame 30 can reduce the complexity of an exchange or a removal of an optical module 50.

The sensor frame 30 and the carrying frame 40 are decoupled from one another (not illustrated), such that reaction forces of the actuators (not illustrated) of the optical modules 50 cannot dynamically excite the sensor frame 30. The sensor frame 30 and the carrying frame 40 are also mounted in a decoupled manner visa vis the projection exposure apparatus 1 (likewise not illustrated), as a result of which excitations from the ground or other systems of the projection exposure apparatus may have no or only a negligibly small influence on the imaging quality of the projection exposure apparatus.

The EUV radiation 14 emitted by the light source 3 illustrated in FIG. 1 and guided onto the reticle 7 by way of the illumination optical unit 4 likewise illustrated in FIG. 1 is reflected at the reticle 7 and is reflected by the individual modules 50 via the optical elements 52 which are mirrors 52 and is imaged onto the wafer 12. The reticle 7 is arranged in a reticle holder 8 and can be moved with the latter parallel to the object plane 6. The wafer 12 is arranged in a wafer holder 13 and can likewise be moved parallel to an image plane 11.

Figure 3A:
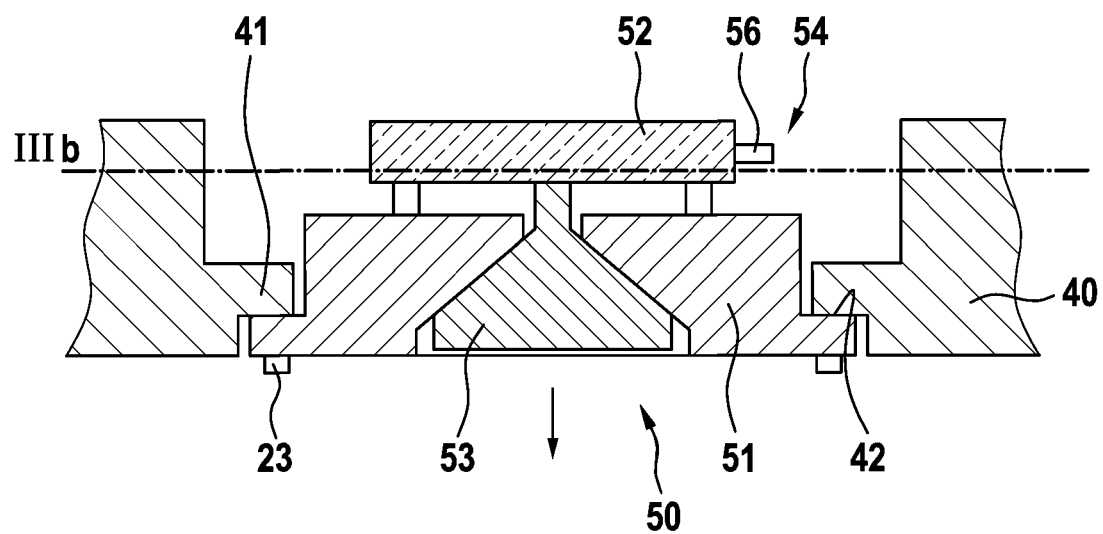
FIGS. 3A-3C show a detail view of the disclosure.

FIG. 3A shows a detail view of the disclosure, illustrating an excerpt from the carrying frame 40 with an optical module 50 in a sectional illustration. The optical module 50 typically includes three actuators 53, which are bipods and can position the optical element 52 in six degrees of freedom. In the example shown, only one actuator 53 is illustrated for reasons of clarity. The actuators 53 are connected to a module carrying frame 51, which is fixed to a flange 41 of the carrying frame 40 by screws 23, whereby a mechanical interface 42 is formed between module carrying frame 51 and carrying frame. By virtue of this arrangement, it is easily possible for the optical module 50 to be released from the carrying frame 40 and demounted. The optical module 50 stiffens the carrying frame 40 by virtue of the screw connection (an overdetermined screw connection) with the result that the eigenmodes of the carrying frame 40 are advantageously increased. In this case, the actuators 53 are configured, or arranged in the module carrying frame 51, so that they can be exchanged even without the optical module 50 being demounted (see arrow). The optical element 52 includes the sensor element 56 of the sensor 54, which together with the actuator 53 and an open-loop or closed-loop control (not illustrated) can position and orient the optical element 52 with an accuracy in the range of less than one nanometre.

Figure 3B:
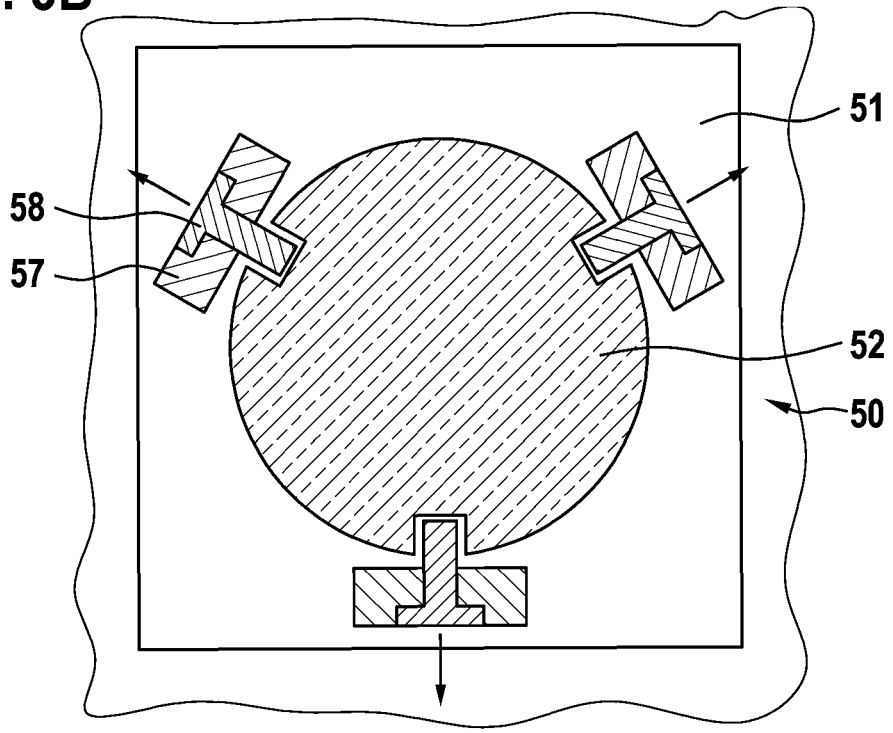

FIG. 3B shows a further detail view of the disclosure, illustrating the optical module 50 in a sectional illustration. Besides the actuators 53 and sensors 54 illustrated in FIG. 3A, the optical module 50 also includes end stops 58, which restrict the movement of the optical element, as a result of which the actuators, such as Lorenz actuators, for example, and also the optical element 52 itself are protected against damage. Actuators and sensors are not illustrated in FIG. 3B for reasons of clarity. The end stops 58 are held in mounts 57 arranged on the module carrying frame 51, wherein the end stops 58 are configured so that they are easily accessible and exchangeable with the module 50 having been demounted.

Figure 3C:
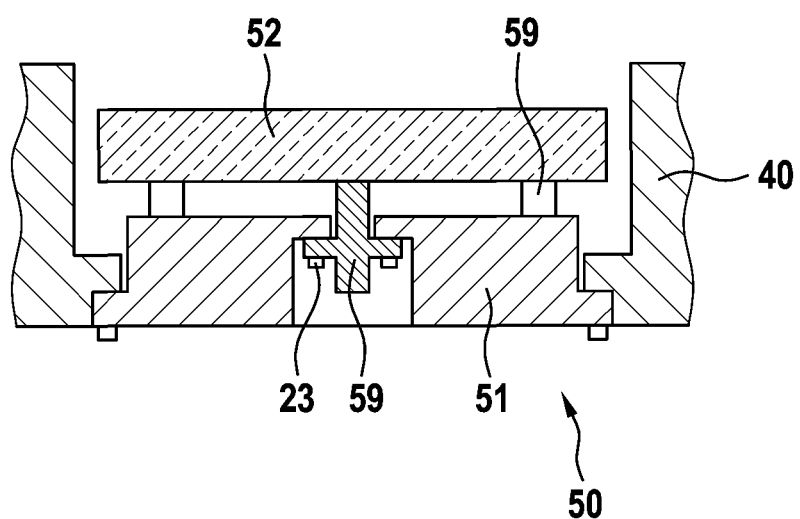

FIG. 3C shows a further detail view of the disclosure, illustrating an excerpt from the carrying frame 40 and an optical module 50 in a sectional illustration. The actuators, sensors and also the end stops shown in FIG. 3B are illustrated in FIG. 3C for reasons of clarity. The transport securing mechanisms 59 are connected to the module carrying frame 51 via screws 23. The transport securing mechanisms 59 are illustrated in the transport position, that is to say the position used for transporting the optical modules 50. The transport securing mechanisms 59 presses, for example by way of a spring force, the optical element 52 into the end stops thereof (not illustrated) to fix the optical element 52. The transport securing mechanisms 59 are also configured so that they can be exchanged even without the optical module 50 being demounted.

All the functional elements involved for the positioning and orientation of the optical element 52, that is to say actuators, sensors, end stops and transport securing mechanisms, are arranged on the module and can thus be exchanged in a simple manner and without the module being disassembled, in part even without the module being demounted from the projection optical unit.

Figure 4A:
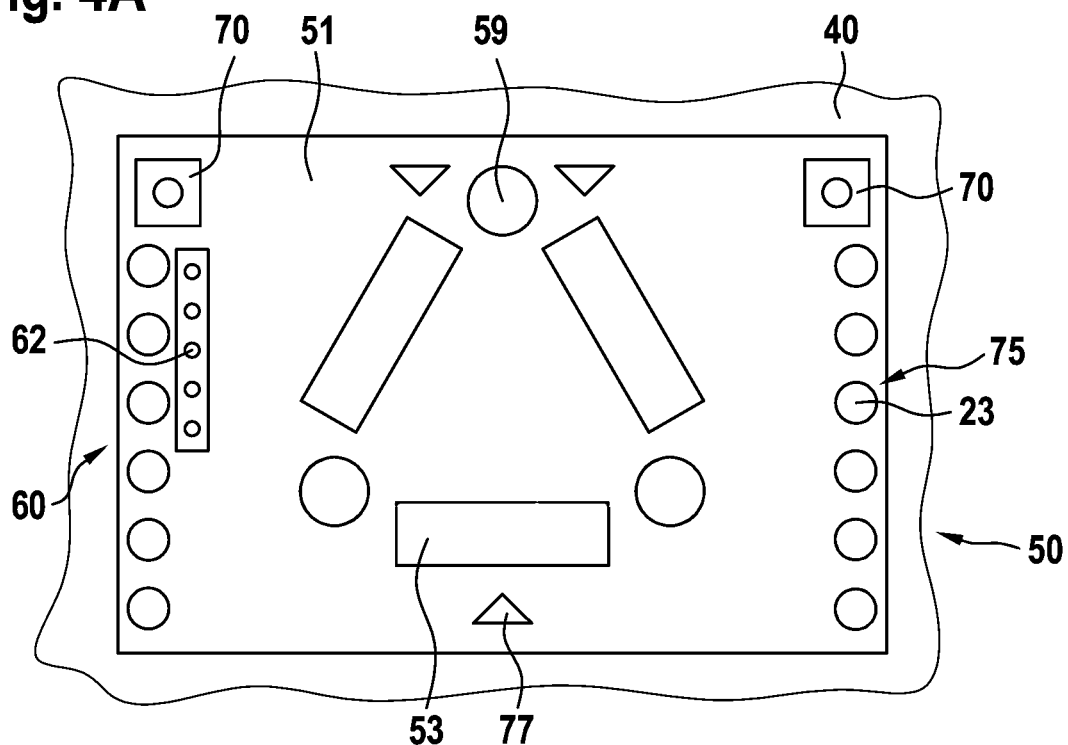
FIGS. 4A-4B show a further detail view of the disclosure.

FIG. 4A shows a further detail view of the disclosure, illustrating the optical module 50 installed in the carrying frame 40 from the rear side facing away from the optical element (not visible). The optical module 50 includes three actuators 53, which are arranged at an angle of 120° in each case, three transport securing mechanisms 59, which are arranged offset with respect to the actuators 53 by 60° in each case, and three interfaces 77 for an exchange device (not illustrated) for exchanging the optical module 50. Furthermore, interfaces 62, 70 for the infrastructure 60 of the optical module 50 are also arranged on the rear side of the optical module 50. In two of the four corners of the module carrying frame 51 configured in a rectangular fashion, there is in each case an interface 70 for fluid lines, by which the optical module 50 can be connected to a compressed air line or a hydraulic line. An interface 62 for cables, such as for electrical or optical lines, is arranged in direct proximity, a plurality of plug connections being arranged next to one another. A plurality of screws 23—arranged in a row—of the screw connection 75 of the optical module 50 to the carrying frame 40 are arranged on two sides of the module carrying frame 51. By virtue of this overdetermined connection, the contact stiffness can be designed such that the module carrying frame 51 as part of the carrying frame positively can increase the eigenmodes of the carrying frame 40, and the module carrying frame 51 can be prevented from slipping on the carrying frame 40, for example as a result of shock events during transport.

Figure 4B:
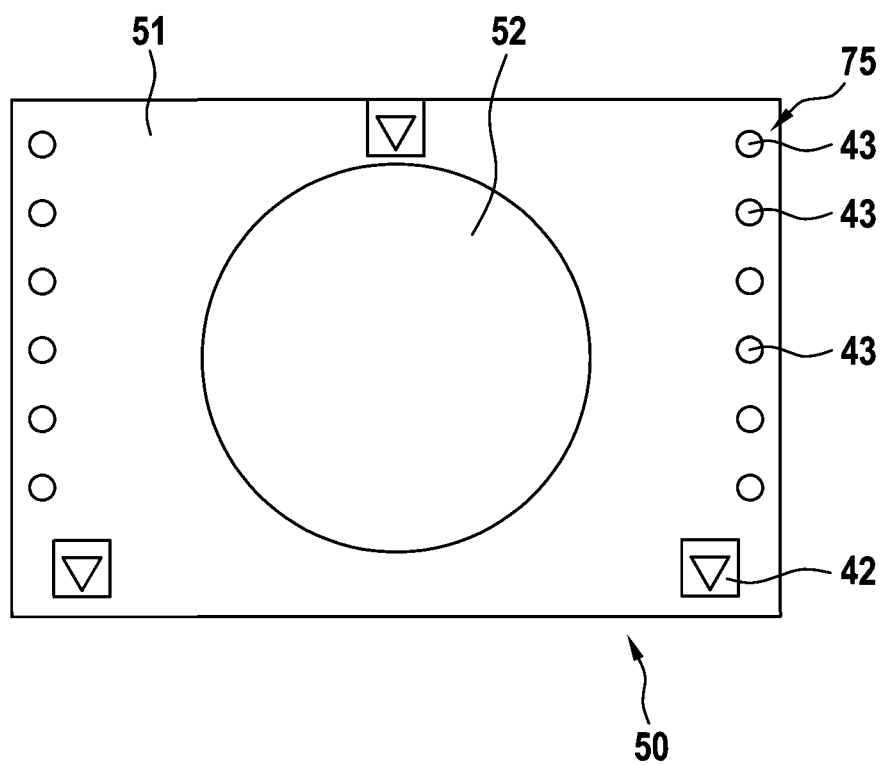

FIG. 4B shows a further detail view of the disclosure, illustrating an optical module 50 having an optical element 52 in a plan view from the front side of the optical module 50. Actuators, sensors, end stops and transport securing mechanisms are not illustrated for reasons of clarity, or are concealed by the optical element 52. Furthermore, three mechanical interfaces 42 are arranged at an angle of 120° with respect to one another. The mechanical interfaces 42 are configured so that the optical module 50 can be positioned on the carrying frame (not illustrated) with an accuracy of below 50 μm (e.g., below 30 μm, below 20 μm). The travel of the actuators (not illustrated) is such that the optical element 52 can be positioned in its desired position and desired orientation after the optical module 50 has been screwed to the carrying frame. After the module carrying frame 51 has been oriented on the carrying frame (not illustrated), it is connected to the carrying frame by the screw connection 75, only the through holes 43 of the screw connection 75 being illustrated in FIG. 4B.

Figure 5A:
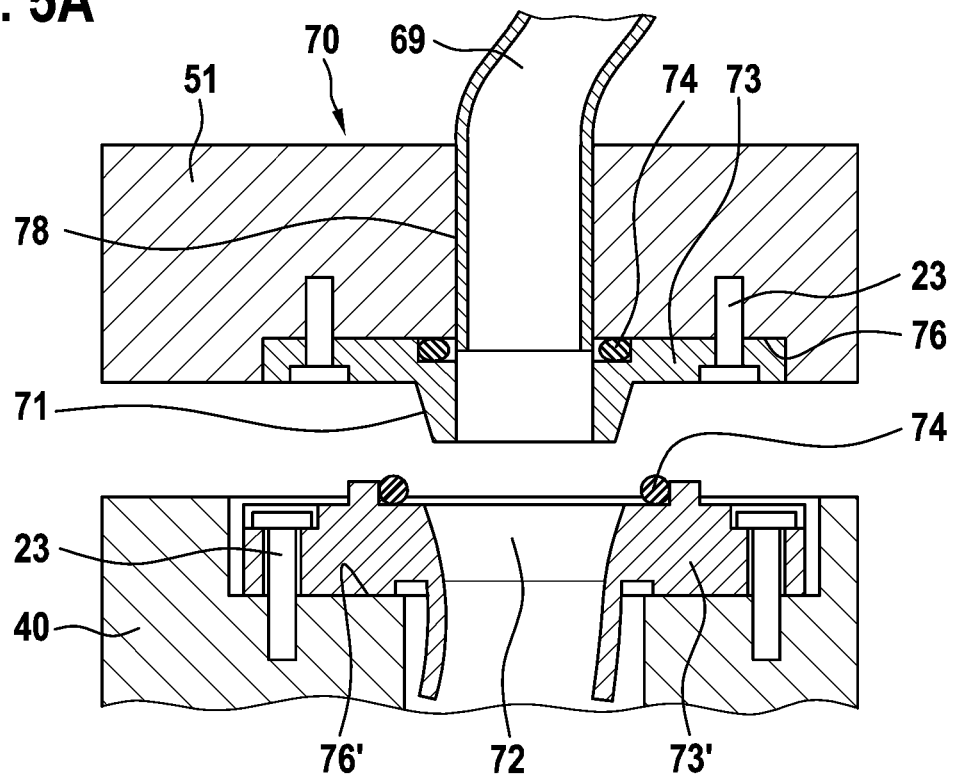
FIGS. 5A-5B show a further detail view of the disclosure.

FIG. 5A shows a further detail view of the disclosure, illustrating an interface 70 for fluid lines 69. The interface 70 includes two adapters 73, 73', which are respectively arranged in a cutout 76, 76' on the module carrying frame 51 and on the carrying frame 40. The line 69 is guided in a receptacle 78 in the module carrying frame 51 and the end of the line bears against the adapter 73. The latter is additionally sealed visa vis the cutout 76 by way of a seal 74 and fixed by screws 23 in the module carrying frame 51. A conically tapering tube section 71 is on the side of the adapter 73 which is directed towards the corresponding adapter 73' of the carrying frame 40. When the module 50 is screwed to the carrying frame 40, the tube section 71 descends into a corresponding opening 72 in the adapter 73' of the carrying frame 40 and creates a tight connection as a result of the conical arrangement. A seal 74 is arranged outside the opening 72 and brings about an additional sealing between the adapter 73'. The adapter 73' is arranged in a cutout 76' of the carrying frame 40 and is connected to the latter via a screw 23.

Figure 5B:
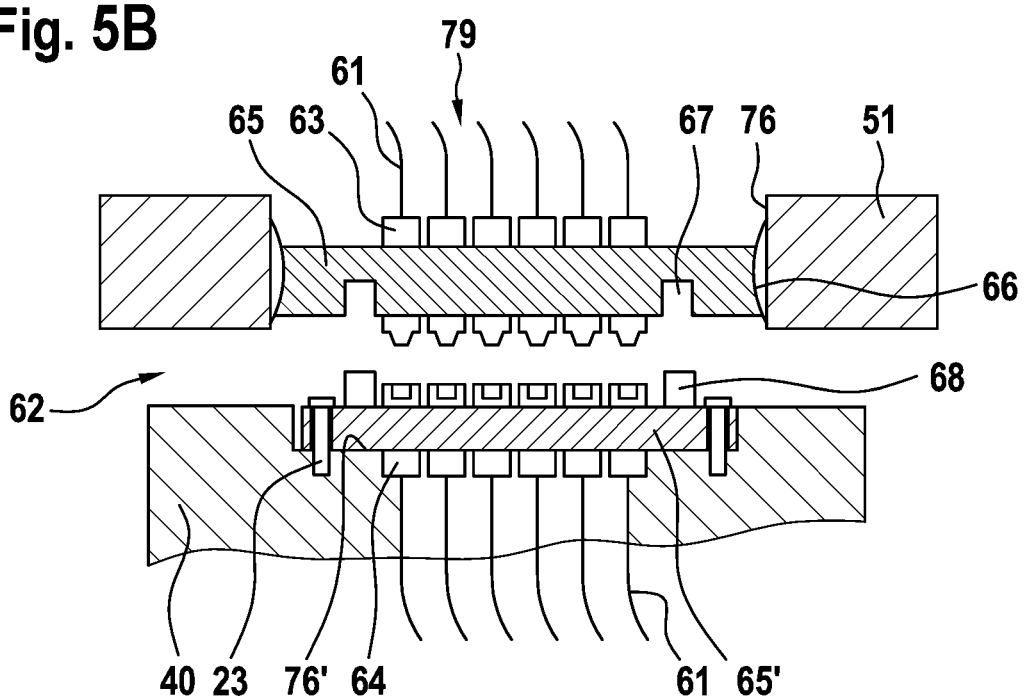

FIG. 5B shows a further detail view of the disclosure, illustrating an interface 62 for lines 61, which can be, for example, electrical cables and/or optical cables. The sockets 64 of the plug connection 79 are arranged in a socket receptacle 65', which in turn is arranged in a cutout 76' of the carrying frame 40 and is connected to the latter by screws 23. The plugs 63 corresponding to the sockets 64 are arranged in a plug receptacle 65, which is connected to the module carrying frame 51 in a cutout 76 by way of an elastic mount 66, such as a spring. For aligning the plugs 63 and sockets 64 during the connection of the module carrying frame 51 and the carrying frame 40, depressions 67 are formed in the plug receptacle 65, and pins 68 having a corresponding geometry, which are arranged on the socket receptacle 65', can enter into the depressions. As a result, the plugs 63 and sockets 64 are prealigned and can be plugged together in a simple manner. An encoding can also be established by the pins 68, such that different receptacles 65, 65' can be plugged only at the positions provided for them and in the correct orientation, as a result errors owing to incorrect plug connections 79 can advantageously be avoided.

Figure 6:
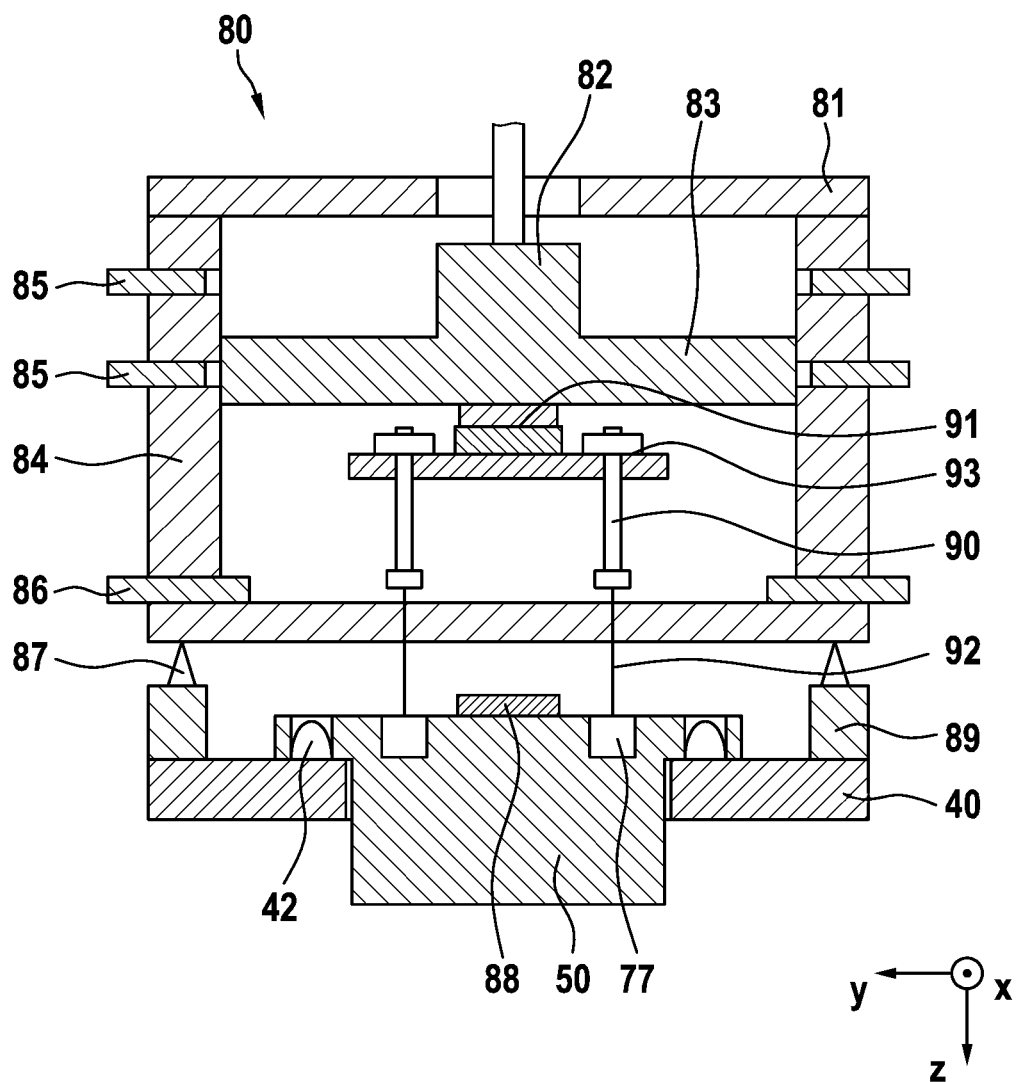
FIG. 6 shows a basic illustration of a tool for exchanging a module.

FIG. 6 shows an exchange device 80 for exchanging or mounting of an optical module 50 of a projection exposure apparatus. The exchange device 80 includes a rack 81 having a guide 84, on which a slide 83 can be moved in one axis. The slide 83 can be locked with the aid of a locking mechanism 85 at the upper end of the rack 81. A stop 86 is arranged at the lower end of the guide 84, the stop being configured so that the slide 83 and the adapters 90 secured thereto cannot collide with the optical module 50. The exchange device 80 can be attached by a link 82 to a commercially available ceiling crane (not illustrated) such as is usually used in production halls. With the aid of positioning pins 87 arranged at the interface 89 of the carrying frame 40, the rack 81 is positioned on the interface 89. The optical module 50 is connected to the slide 83 by way of the adapters 90, wherein both the interface 77 to the optical module 50 and the interface 93 to the floating mount 91 of the adapter 90 are bayonet catches, wherein the two bayonet catches 77, 93 are connected to one another by a cable 92. In this case, the bayonet catch 93 connected to the floating mount 91 is configured so that the length of the adapter 90 is adjustable. In this regard, before the optical module 50 is lowered onto the carrying frame 40, the optical module 50, with the aid of a tilt sensor 88 arranged on the optical module 50, can be oriented parallel to the mechanical interface 42 on the carrying frame 40. During the exchange process, the mechanical interface 42 is adapted by way of washers (not illustrated), so-called spacers, such that the optical module 50 is positioned in terms of position and orientation within the scope of the tolerances at the position before the exchange.

LIST OF REFERENCE SIGNS

1 Projection exposure apparatus
2 Field facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate field focal plane
16 Pupil facet mirror
17 Assembly
18 Mirror
19 Mirror
20 Mirror
21 Reticle module
22 Wafer module
23 Screw
30 Sensor frame
40 Carrying frame
41 Flange
42 Mechanical interface
43 Through hole
50 Optical module
51 Module carrying frame
52 Optical element
53 Actuator
54 Sensor
55 Sensor reference
56 Sensor element
57 Mount
58 End stop
59 Transport securing mechanisms
60 Infrastructure
61 Cable
62 Cable interface
63 Plug
64 Socket
65, 65' Receptacle
66 Elastic mount
67 Depression
68 Pin
69 Line
70 Line interface
71 Tube section
72 Opening
73, 73' Adapter
74 Seal
75 Screw connection of carrying frame
76, 76' Cutout for adapter
77 Interface of exchange device
78 Line receptacle
79 Plug connector
80 Exchange device
81 Rack
82 Crane link
83 Slide
84 Guide
85 Slide locking means
86 Lower stop
87 Positioning pin for rack on carrying frame
88 Tilt sensor
89 Interface of carrying frame—Exchange device
90 Adapter
91 Adapter mount
92 Cable
93 Interface of adapter mount

What is claimed is:

1. A projection exposure apparatus, comprising:
   a projection optical unit, comprising:
      a sensor frame;
      a carrying frame; and
      a module supported by the carrying frame, the module comprising:
         an optical element;
         actuators configured to position and/or orient the optical element;
         an infrastructure comprising interfaces configured to separate the module from the projection optical unit; and
         a module carrying frame connected to the carrying frame in an overdetermined manner,
   wherein the sensor frame is a reference for positioning and/or orienting the optical element, and the projection exposure apparatus is a semiconductor lithography projection exposure apparatus.

2. The projection exposure apparatus of claim 1, wherein the infrastructure comprises at least one member selected from the group consisting of electrical lines, optical lines and lines for a fluid.

3. The projection exposure apparatus of claim 1, wherein the actuators are supported by the module carrying frame.

4. The projection exposure apparatus of claim 1, wherein the actuators are exchangeable without demounting the module carrying frame.

5. The projection exposure apparatus of claim 1, wherein the module comprises a sensor.

6. The projection exposure apparatus of claim 5, further comprising a reference of the sensor, wherein the reference of the sensor is supported by the sensor frame.

7. The projection exposure apparatus of claim 6, wherein the reference of the sensor is configured so that it is not altered due to demounting of the module.

8. The projection exposure apparatus of claim 5, wherein the sensor comprises an interferometer.

9. The projection exposure apparatus of claim 8, wherein the sensor comprises a sensor reference and a sensor element.

10. The projection exposure apparatus of claim 9, wherein the sensor reference is spaced from 10 centimeters to 200 centimeters from the sensor element.

11. The projection exposure apparatus of claim 1, wherein the module carrying frame comprises mechanical interfaces.

12. The projection exposure apparatus of claim 11, wherein the mechanical interfaces are configured to position and/or orient the carrying frame.

13. The projection exposure apparatus of claim 1, wherein the module carrying frame is configured so that a stiffness of the carrying frame is greater when the module carrying frame is connected to the carrying frame than when the module carrying frame is not connected to the carrying frame.

14. The projection exposure apparatus of claim 1, wherein the sensor frame is in a volume defined by the carrying frame.

15. The projection exposure apparatus of claim 1, wherein the sensor frame comprises a plurality of subframes.

16. The projection exposure apparatus of claim 15, further comprising sensors configured to reference the subframes with respect to one another.

17. The projection exposure apparatus of claim 1, wherein the optical element comprises a mirror.

18. The projection exposure apparatus of claim 1, wherein the projection optical unit comprises a plurality of modules and a plurality of optical elements, and each optical element of the projection optical unit is arranged in a corresponding module.

19. The projection exposure apparatus of claim 18, wherein the optical elements comprise mirrors.

20. The projection exposure apparatus of claim 1, wherein the projection exposure apparatus is configured so that the module is exchangeable with the projection optical unit.

21. The projection exposure apparatus of claim 1, wherein the projection optical unit comprises a plurality of modules.

22. The projection exposure apparatus of claim 21, wherein each module is supported by the carrying frame.

23. The projection exposure apparatus of claim 22, wherein each module comprises an optical element, actuators configured to position and/or orient the optical element, and an infrastructure comprising interfaces configured to separate the module from the projection optical unit.

24. The projection exposure apparatus of claim 23, wherein the infrastructures are connected in parallel with one another.

25. The projection exposure apparatus of claim 23, wherein the infrastructures are connected in series with one another.

26. A projection optical unit, comprising:
a sensor frame;
a carrying frame; and
a module supported by the carrying frame, the module comprising:
  an optical element;
  actuators configured to position and/or orient the optical element;
  an infrastructure comprising interfaces configured to separate the module from the projection optical unit; and
  a module carrying frame connected to the carrying frame in an overdetermined manner,
wherein the sensor frame is a reference for positioning and/or orienting the optical element, and the projection optical unit is a semiconductor lithography projection optical unit.

27. A projection exposure apparatus, comprising:
a projection optical unit, comprising:
  a sensor frame;
  a carrying frame; and
  a module supported by the carrying frame, the module configured to house an optical element, the module comprising:
    an infrastructure comprising interfaces configured to separate the module from the projection optical unit; and
    a module carrying frame connected to the carrying frame in an overdetermined manner,
wherein the sensor frame is a reference for positioning and/or orienting the optical element, and the projection exposure apparatus is a semiconductor lithography projection exposure apparatus.

28. A projection optical unit, comprising:
a sensor frame;
a carrying frame; and
a module supported by the carrying frame, the module configured to house an optical element, the module comprising:
  an infrastructure comprising interfaces configured to separate the module from the projection optical unit; and
  a module carrying frame connected to the carrying frame in an overdetermined manner,
wherein the sensor frame is a reference for positioning and/or orienting the optical element, and the projection optical unit is a semiconductor lithography projection optical unit.

29. A method, comprising:
exchanging a module of a projection optical unit of a semiconductor lithography projection exposure apparatus,
wherein:
  the projection optical unit comprises a sensor frame and a carrying frame;
  the carrying frame supports the module;
  the module comprises an optical element and a module carrying frame;
  the module carrying frame is connected to the carrying frame in an overdetermined manner;
  the sensor frame is a reference for positioning and/or orienting the optical element; and
  the sensor frame remains in the projection exposure apparatus during the exchange of the module.

* * * * *